US008878428B2

(12) United States Patent
Sasaki et al.

(10) Patent No.: US 8,878,428 B2
(45) Date of Patent: Nov. 4, 2014

(54) DISPLAY DEVICE THAT PREVENTS WARPAGE OF POLARIZER

(71) Applicant: Japan Display Inc., Tokyo (JP)

(72) Inventors: Tohru Sasaki, Tokyo (JP); Tomoki Nakamura, Tokyo (JP); Yasuyuki Yamada, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/069,405

(22) Filed: Nov. 1, 2013

(65) Prior Publication Data

US 2014/0125216 A1    May 8, 2014

(30) Foreign Application Priority Data

Nov. 7, 2012 (JP) .................. 2012-245540

(51) Int. Cl.
*H05B 33/14* (2006.01)
*G02B 5/30* (2006.01)

(52) U.S. Cl.
CPC .................... *G02B 5/3025* (2013.01)
USPC .............. 313/483; 313/512; 445/24

(58) Field of Classification Search
USPC .......... 313/483, 501, 512, 507, 508; 257/E33.061, E33.067
See application file for complete search history.

(56) References Cited

U.S. PATENT DOCUMENTS

| 8,040,042 B2* | 10/2011 | Yukinobu | 313/504 |
| 2008/0054785 A1* | 3/2008 | Hayashi | 313/483 |
| 2011/0050082 A1* | 3/2011 | Inoue et al. | 313/483 |

FOREIGN PATENT DOCUMENTS

JP    2010-262057    11/2010

* cited by examiner

*Primary Examiner* — Tracie Y Green
(74) *Attorney, Agent, or Firm* — Antonelli, Terry, Stout & Kraus, LLP.

(57) ABSTRACT

A display device of the invention includes: a self-light-emitting display panel including a first substrate and a second substrate; a first heat-shrinkable film for anti-reflection bonded to a surface of the first substrate on the side opposite to the second substrate and having different shrinkage rates depending on directions; and a second heat-shrinkable film bonded to a surface of the second substrate on the side opposite to the first substrate and having different shrinkage rates depending on directions, wherein a first shrinkage direction that is a direction having a highest shrinkage rate among directions in which the first heat-shrinkable film shrinks is the same as a second shrinkage direction that is a direction having a highest shrinkage rate among directions in which the second heat-shrinkable film shrinks.

13 Claims, 8 Drawing Sheets

DISPLAY DEVICE THAT PREVENTS WARPAGE OF POLARIZER

CROSS-REFERENCE TO RELATED APPLICATION

The present application claims priority from Japanese application JP 2012-245540 filed on Nov. 7, 2012, the content of which is hereby incorporated by reference into this application.

BACKGROUND OF THE INVENTION

1. Field of the Invention

The present invention relates to a display device.

2. Description of the Related Art

As display devices for information communication terminals, such as computers, or television receivers, display devices including a liquid crystal display panel, an organic EL display, a field emission display (FED), or the like have been widely used. For example, a display device including a liquid crystal display panel displays an image by changing the alignment of liquid crystal molecules sealed between two substrates of the liquid crystal display panel to thereby change the degree of transmission of light emitted from a backlight on the liquid crystal display panel. In recent years, such a display device has been used especially for mobile phones or smartphones, so that the thinning of the display device is required.

As such a display device, a configuration including a display panel including a first substrate and a second substrate and a polarizer attached to one surface of the display panel has been known. Moreover, JP 2010-262057 A (Patent Document 1) discloses a configuration in which a base layer and a reinforcing member are bonded to a plastic substrate.

SUMMARY OF THE INVENTION

Polarizers are drawn in a plurality of directions while applying heat in molding, thereby having shrinkage anisotropy. For this reason, in the case of, for example, a display device having a polarizer bonded to a first substrate, the polarizer shrinks in width and direction different from those of the first substrate with the rise of temperature applied to the display device.

Due to this, an influence of stress of the polarizer increases as the first substrate is thinned, which may cause a trouble such as, for example, occurrence of warpage in the display panel. Moreover, in the case of a configuration including a reinforcing member as in the display device disclosed in Patent Document 1, the thickness of the display device is increased by the amount corresponding to the thickness of the reinforcing member.

The invention has been made in view of the circumstances described above, and it is an object of the invention to prevent warpage of a display panel and realize thinning.

(1) A display device according to an aspect of the invention includes: a self-light-emitting display panel including a first substrate and a second substrate; a first heat-shrinkable film for anti-reflection bonded to a surface of the first substrate on the side opposite to the second substrate and having different shrinkage rates depending on directions; and a second heat-shrinkable film bonded to a surface of the second substrate on the side opposite to the first substrate and having different shrinkage rates depending on directions, wherein a first shrinkage direction that is a direction having a highest shrinkage rate among directions in which the first heat-shrinkable film shrinks is the same as a second shrinkage direction that is a direction having a highest shrinkage rate among directions in which the second heat-shrinkable film shrinks.

(2) In the display device according to the aspect of the invention, in (1), the shrinkage rate of the second heat-shrinkable film in the second shrinkage direction may be equal to that of the first heat-shrinkable film in the first shrinkage direction.

(3) In the display device according to the aspect of the invention, in (1) or (2), the perimeter of the second heat-shrinkable film may be located, in plan view, outside the perimeter of the first heat-shrinkable film.

(4) In the display device according to the aspect of the invention, in (1), the second heat-shrinkable film may be divided into a plurality of strip-shaped bodies, the plurality of strip-shaped bodies may be arranged spaced apart from each other in a direction orthogonal to the second shrinkage direction, and the shrinkage rate of the strip-shaped body in the second shrinkage direction may be higher than that of the first heat-shrinkable film in the first shrinkage direction.

(5) In the display device according to the aspect of the invention, in (1), the shrinkage rate of the second heat-shrinkable film in the second shrinkage direction may be higher than that of the first heat-shrinkable film in the first shrinkage direction, and a plurality of slits may be disposed along the second shrinkage direction in the second heat-shrinkable film.

(6) In the display device according to the aspect of the invention, in anyone of (3) to (5), the display device may further include: a first adhesive layer arranged between the first substrate and the first heat-shrinkable film to bond the first substrate and the first heat-shrinkable film together; and a second adhesive layer arranged between the second substrate and the second heat-shrinkable film to bond the second substrate and the second heat-shrinkable film together, and the adhesive force of the second adhesive layer may be equal to or less than that of the first adhesive layer.

(7) In the display device according to the aspect of the invention, in any one of (1) to (6), the thickness of the second heat-shrinkable film may be smaller than that of the first heat-shrinkable film.

(8) In the display device according to the aspect of the invention, in any one of (1) to (7), the first heat-shrinkable film may be a polarizer.

(9) In the display device according to the aspect of the invention, in any one of (1) to (8), the first substrate and the second substrate may be formed of a resin.

(10) In the display device according to the aspect of the invention, in any one of (1) to (9), a surface of the second heat-shrinkable film on the side opposite to the first substrate may be covered with a metal film.

(11) A display device according to another aspect of the invention includes: a self-light-emitting display panel including a first substrate and a second substrate; and a first heat-shrinkable film for anti-reflection bonded to a surface of the first substrate on the side opposite to the second substrate and having different shrinkage rates depending on directions, wherein a surface of the second substrate on the side opposite to the first substrate constitutes a plate-shaped plurality of wall portions extending along a first shrinkage direction that is a direction having a highest shrinkage rate among directions in which the first heat-shrinkable film shrinks, and the plurality of wall portions are spaced apart from each other in a direction orthogonal to the first shrinkage direction.

(12) In the display device according to the aspect of the invention, in (11), the wall portion may be covered with a metal film.

(13) A display device according to still another aspect of the invention includes: a first heat-shrinkable film having different shrinkage rates depending on directions; a second heat-shrinkable film having different shrinkage rates depending on directions; and a self-light-emitting display panel interposed between the first heat-shrinkable film and the second heat-shrinkable film, wherein the first heat-shrinkable film is bonded on a display side of the display panel, the second heat-shrinkable film is bonded to a surface of the display panel opposite to the display side, and a first shrinkage direction that is a direction having a highest shrinkage rate among directions in which the first heat-shrinkable film shrinks is the same as a second shrinkage direction that is a direction having a highest shrinkage rate among directions in which the second heat-shrinkable film shrinks.

DETAILED DESCRIPTION OF THE INVENTION

Hereinafter, embodiments of the invention will be described based on the drawings. In components appearing in the specification, components having the same function are denoted by the same reference numeral and sign, and the description thereof is omitted. In the drawings referred to in the following description, a portion having a feature is sometimes shown in an enlarged manner for convenience sake to facilitate the understanding of the feature. Therefore, the dimension ratio or the like of each component is not always the same as a real one. Moreover, materials or the like illustrated in the following description are illustrative only. Each component may be different from the illustrated one and can be implemented by modification within a range not changing the gist thereof.

Figure 1:
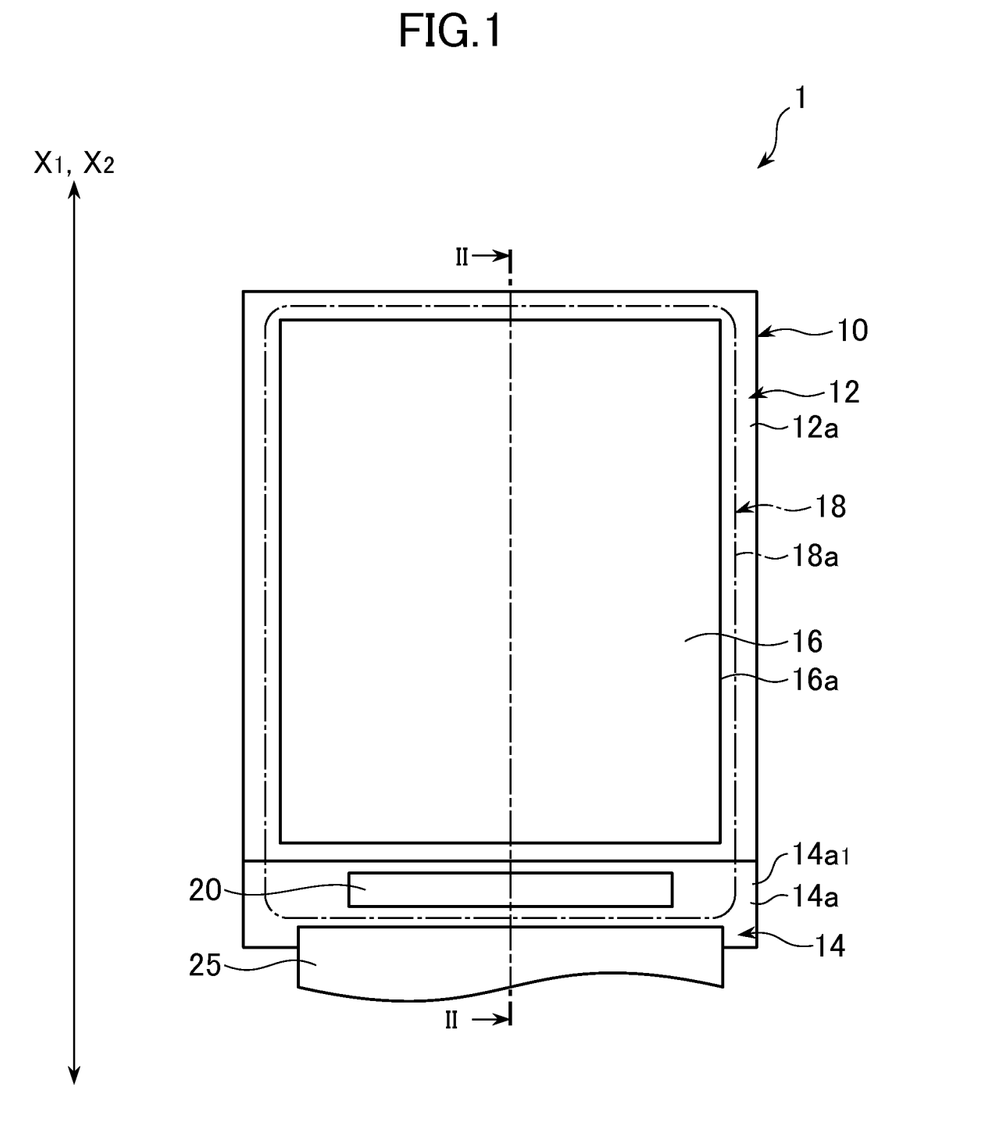
FIG. 1 is a schematic plan view of a display device according to a first embodiment.
Figure 2:
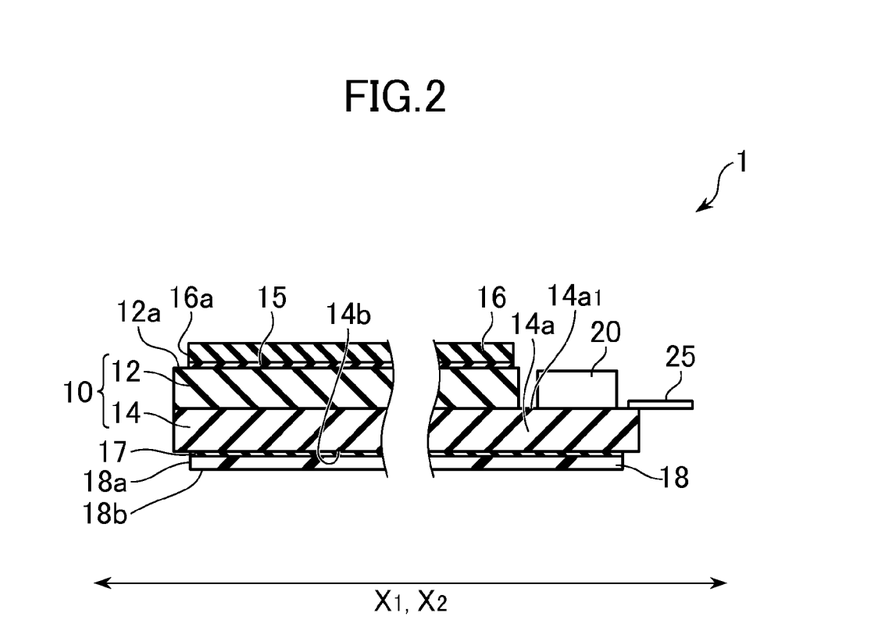
FIG. 2 is a schematic cross-sectional view of the display device shown in FIG. 1, taken along a cutting-plane line II-II.

First, a display device 1 according to a first embodiment of the invention will be described. The display device 1 according to the embodiment includes a self-light-emitting display panel 10, a first heat-shrinkable film 16, and a second heat-shrinkable film 18. In the embodiment, a self-light-emitting display device will be described as an example of a display device.

FIG. 1 is a schematic plan view of the display device 1 according to the first embodiment. FIG. 2 is a schematic cross-sectional view of the display device 1 shown in FIG. 1, taken along a cutting-plane line II-II.

The display panel 10 is, for example, an organic EL display panel and includes a first substrate 12 and a second substrate 14. The first substrate 12 is, for example, a color filter substrate and disposed with not-shown color filters. The second substrate 14 is, for example, a TFT (Thin Film Transistor) substrate. A not-shown filler is sealed between the first substrate 12 and the second substrate 14. The first substrate 12 and the second substrate 14 in the embodiment are each formed of a resin such as, for example, polyethylene terephthalate, polyethylene naphthalate, polycarbonate, polyether sulfone, or polyimide. However, the material of the substrates is not limited thereto and may be glass or the like.

The second substrate 14 is formed such that, for example, the length of the second substrate 14 in a longitudinal direction thereof is larger than that of the first substrate 12 in a longitudinal direction thereof. For this reason, a portion of the second substrate 14 does not overlap the first substrate 12 but protrudes in one direction. The portion of the second substrate 14 not overlapping the first substrate 12 but protruding therefrom is defined as a portion 14a, and an upper surface of the portion 14a is defined as an upper surface $14a_1$. For example, an integrated circuit chip 20 and a flexible wiring board 25 are disposed on the upper surface $14a_1$.

The first heat-shrinkable film 16 is a film for anti-reflection, for which, for example, a polarizer such as a circularly polarizer can be used. The first heat-shrinkable film 16 has a heat-shrinkable property and has different shrinkage rates depending on directions. In the embodiment, a direction having a highest shrinkage rate among directions in which the first heat-shrinkable film 16 shrinks is defined as a first shrinkage direction $X_1$.

Between the first substrate 12 and the first heat-shrinkable film 16, a first adhesive layer 15 that bonds the first substrate 12 and the first heat-shrinkable film 16 together is arranged. With such a configuration, the first heat-shrinkable film 16 is bonded via the first adhesive layer 15 to an upper surface 12a of the first substrate 12 on the side opposite to the second substrate 14.

As the first adhesive layer 15, a double-faced tape or the like, for example, can be used. However, another member such as a liquid adhesive may be used as long as the first substrate 12 and the first heat-shrinkable film 16 can be bonded together.

The second heat-shrinkable film 18 is a film having a heat-shrinkable property and has different shrinkage rates depending on directions. In the embodiment, a direction having a highest shrinkage rate among directions in which the second heat-shrinkable film 18 shrinks is defined as a second shrinkage direction $X_2$. The second heat-shrinkable film 18 is bonded to a lower surface 14b of the second substrate 14 such that the second shrinkage direction $X_2$ is the same direction as the first shrinkage direction $X_1$.

The shrinkage rate of the second heat-shrinkable film 18 in the second shrinkage direction $X_2$ in the embodiment is assumed as being equal to, for example, the shrinkage rate of the first heat-shrinkable film 16 in the first shrinkage direction $X_1$. It is sufficient that the shrinkage rate of the second heat-shrinkable film 18 in the second shrinkage direction $X_2$ is appropriately set according to the size of the first heat-shrinkable film 16 or the size of the second heat-shrinkable film 18 and the shrinkage rate of the first heat-shrinkable film 16 in the first shrinkage direction $X_1$. For this reason, the shrinkage rate of the second heat-shrinkable film 18 in the second shrinkage direction $X_2$ may be higher than the shrinkage rate in the first shrinkage direction $X_1$.

Moreover, it is sufficient that the second shrinkage direction $X_2$ and the heat shrinkage rate in the second shrinkage direction $X_2$ are defined by adjusting conditions of heat drawing when forming the second heat-shrinkable film 18 according to the first shrinkage direction $X_1$ of the first heat-shrinkable film 16 and the heat shrinkage rate in the first shrinkage direction $X_1$. That is, the first heat-shrinkable film 16 and the second heat-shrinkable film 18 are bonded to the display panel 10 while adjusting the shrinkage directions so as to suppress warpage of the display panel 10. In the embodiment, since the first shrinkage direction $X_1$ and the second shrinkage direction $X_2$ are set to be the same as each other, the shrinkage of a front surface of the display panel can be cancelled out by the shrinkage of a rear surface thereof. By arranging the first heat-shrinkable film 16 and the second heat-shrinkable film 18 in this manner, the display device 1 with less deformation can be provided.

A perimeter 18a of the second heat-shrinkable film 18 is preferably located at the same position as a perimeter 16a of the first heat-shrinkable film 16 or located, in plan view, outside the perimeter 16a. The thickness of the second heat-shrinkable film 18 is preferably smaller than that of the first heat-shrinkable film 16, but may be the same as that of the first heat-shrinkable film 16.

For the material of the second heat-shrinkable film 18, any material having a heat-shrinkable property can be selected according to the heat shrinkage rate of the first heat-shrinkable film 16. Examples of such a material include, for example, polyethylene, polyester, polystyrene, polycarbonate, polyethylene terephthalate, polyimide, and liquid crystal polymer.

Although the second heat-shrinkable film 18 in the embodiment has light permeability, the second heat-shrinkable film 18 may not have light permeability because the display panel 10 is of self-light emitting type. Since the second heat-shrinkable film 18 in the embodiment does not need to have light permeability as described above, a lower surface 18b of the second heat-shrinkable film 18, which is a surface on the side opposite to the first substrate 12, may be covered with a metal film.

Between the second substrate 14 and the second heat-shrinkable film 18, a second adhesive layer 17 that bonds the second substrate 14 and the second heat-shrinkable film 18 together is arranged. With such a configuration, the second heat-shrinkable film 18 is bonded via the second adhesive layer 17 to the lower surface 14b of the second substrate 14, which is a surface on the side opposite to the first substrate 12. As the second adhesive layer 17, a double-faced tape or the like, for example, can be used. However, another member such as a liquid adhesive may be used as long as the second substrate 14 and the second heat-shrinkable film 18 can be bonded together.

It is sufficient that the adhesive force of the second adhesive layer 17 is appropriately adjusted according to the sizes of the first heat-shrinkable film 16 and the second heat-shrinkable film 18 or the heat shrinkage rate in the first shrinkage direction $X_1$ and the heat shrinkage rate in the second shrinkage direction $X_2$. However, the adhesive force of the second adhesive layer 17 is preferably the same as or smaller than that of the first adhesive layer 15.

In the display device 1 in the first embodiment, the first shrinkage direction $X_1$ having a highest shrinkage rate among shrinkage directions of the first heat-shrinkable film 16 is the same as the second shrinkage direction $X_2$ having a highest shrinkage rate among shrinkage directions of the second heat-shrinkable film 18. For this reason, stress of the first heat-shrinkable film 16 acting in the first shrinkage direction $X_1$ is relaxed by stress of the second heat-shrinkable film 18 acting in the second shrinkage direction $X_2$. For this reason, in the display device 1 in the embodiment, warpage of the display panel 10 can be suppressed even when the first substrate 12 and the second substrate 14 are thinned, compared to a display device not having this configuration.

The second heat-shrinkable film 18 of the display device 1 in the embodiment relaxes the stress of the first heat-shrinkable film 16 with the stress of the second heat-shrinkable film 18. Therefore, compared to a display device that suppresses the action of the stress of the first heat-shrinkable film 16 with a reinforcing member, an influence of the stress of the first heat-shrinkable film 16 can be suppressed even with the second heat-shrinkable film 18 whose thickness is smaller than that of a reinforcing member. As has been described above, thinning of the display device 1 in the embodiment can be realized.

In the display device 1 in the embodiment, the adhesive force of the second adhesive layer 17 is equal to or less than that of the first adhesive layer 15. Therefore, when the perimeter 18a of the second heat-shrinkable film 18 is located, in plan view, outside the perimeter 16a of the first heat-shrinkable film 16, or when the shrinkage rate of the second heat-shrinkable film 18 in the second shrinkage direction $X_2$ is higher than that of the first heat-shrinkable film 16 in the first shrinkage direction $X_1$, the shrinkage force of the first heat-shrinkable film 16 acting on the first substrate 12 and the shrinkage force of the second heat-shrinkable film 18 acting on the second substrate 14 can be balanced.

In the display device 1 in the embodiment, the shrinkage rate of the second heat-shrinkable film 18 in the second shrinkage direction $X_2$ is equal to that of the first heat-shrinkable film 16 in the first shrinkage direction $X_1$. Therefore, compared to a display device not having this configuration, warpage of the display panel 10 can be prevented more effectively, and thinning of the display device 1 can be realized.

In the display device 1 in the embodiment, the perimeter 18a of the second heat-shrinkable film 18 is located, in plan view, outside the perimeter 16a of the first heat-shrinkable film 16. Therefore, in the lower surface 14b of the second substrate 14, a region corresponding to a region of the upper surface 12a of the first substrate 12 where the first heat-shrinkable film 16 is bonded is entirely covered with the second heat-shrinkable film 18. Due to this, the shrinkage force of the second heat-shrinkable film 18 acts on the entire region on which the shrinkage force of the first heat-shrinkable film 16 acts. For this reason, a region on which only the shrinkage force of the first heat-shrinkable film 16 acts is not generated, making it possible to prevent part warpage of the display panel 10.

In the display device 1 in the embodiment, the thickness of the second heat-shrinkable film 18 is smaller than that of the first heat-shrinkable film 16. Therefore, compared to a display device not having this configuration, thinning of the display device 1 can be realized.

In the display device 1 in the embodiment, the first heat-shrinkable film 16 is a polarizer. Therefore, thinning of the display panel 10 having a polarizer can be realized.

In the display device 1 in the embodiment, even when the rigidity of the first substrate 12 and the second substrate 14 is lowered, warpage of the display panel 10 is suppressed. Therefore, a material whose rigidity is lower than that of glass, such as a resin, can be used as the material of the first substrate 12 and the second substrate 14. For this reason, compared to a display device not having this configuration, weight reduction of the display device 1 can be realized.

Moreover, since the display device 1 in the embodiment includes the self-light-emitting display panel 10, there is no need to transmit light from the rear surface side of the display panel 10 such as in a liquid crystal display device. When light does not need to transmit through the second substrate 14 as described above, the lower surface 18b of the second heat-shrinkable film 18, which is a surface on the side opposite to the first substrate 12, can be covered with a metal film. With this metal film, heat of the display panel 10 conducts to the metal film. For this reason, compared to a display device not having this configuration, the heat dissipation property of the display panel 10 can be improved. For this reason, there is no need to separately dispose a heat-dissipating plate in the display device 1, making it possible to realize weight reduction and thinning of the display device 1.

As long as the self-light-emitting display panel 10 including the first substrate 12 and the second substrate 14, the first heat-shrinkable film 16, and the second heat-shrinkable film 18 are included, the embodiment may be applied to, for example, an organic EL display device, a field emission display, and the like. When such a self-light-emitting system is employed as the display panel 10, a backlight composed of an optical sheet and a light guide body becomes unnecessary. For this reason, further weight reduction and thinning of the display device 1 are possible. Further, when the display device 1 is an organic EL display device, the display panel 10 does not necessarily need to have both the first substrate 12 and the second substrate 14. The display panel 10 can be composed only of the second substrate 14 having an organic EL light-emitting layer. For this reason, more further weight reduction and thinning of the display device 1 are possible.

Figure 3:
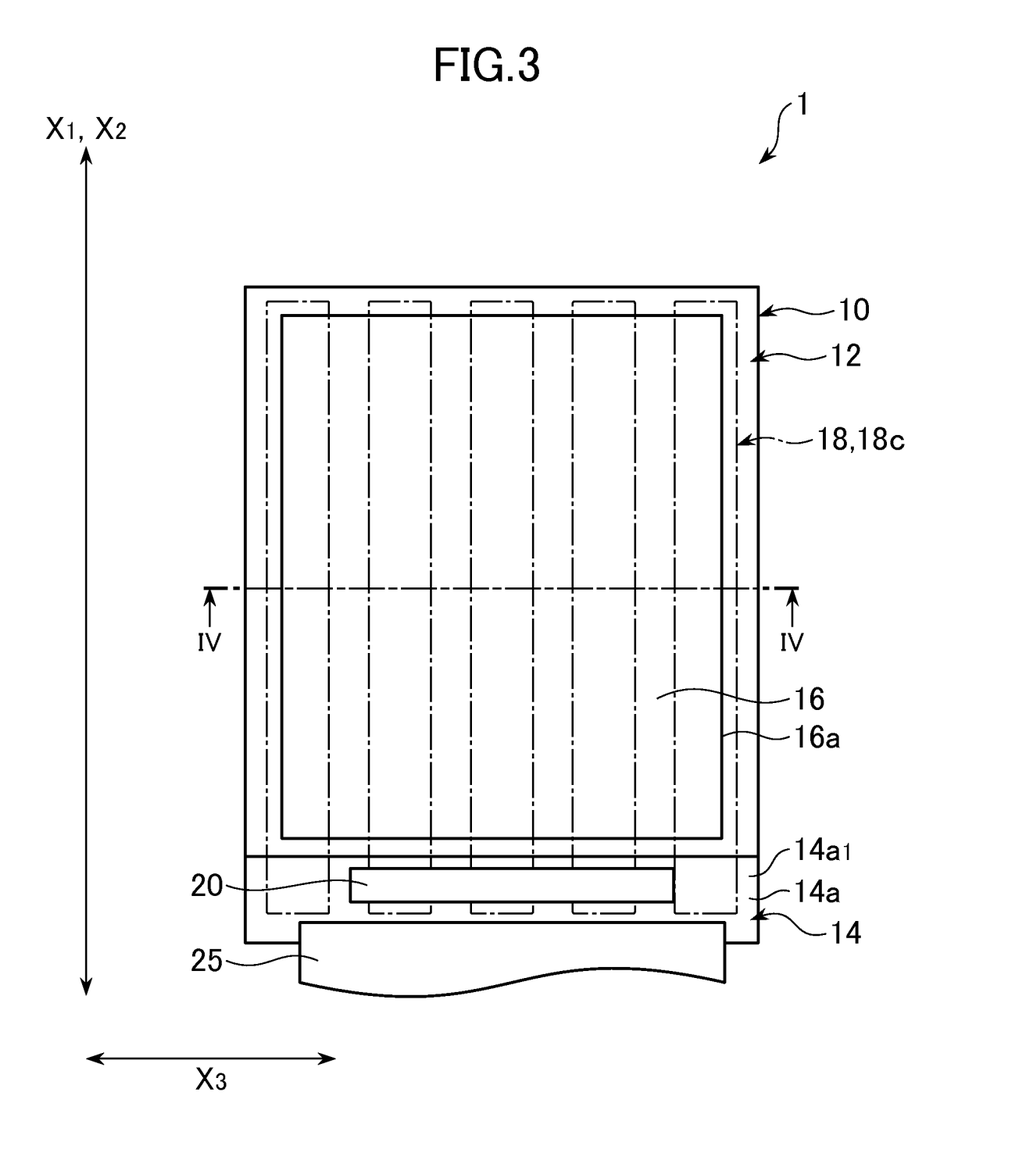
FIG. 3 is a schematic plan view of a display device according to a second embodiment.
Figure 4:
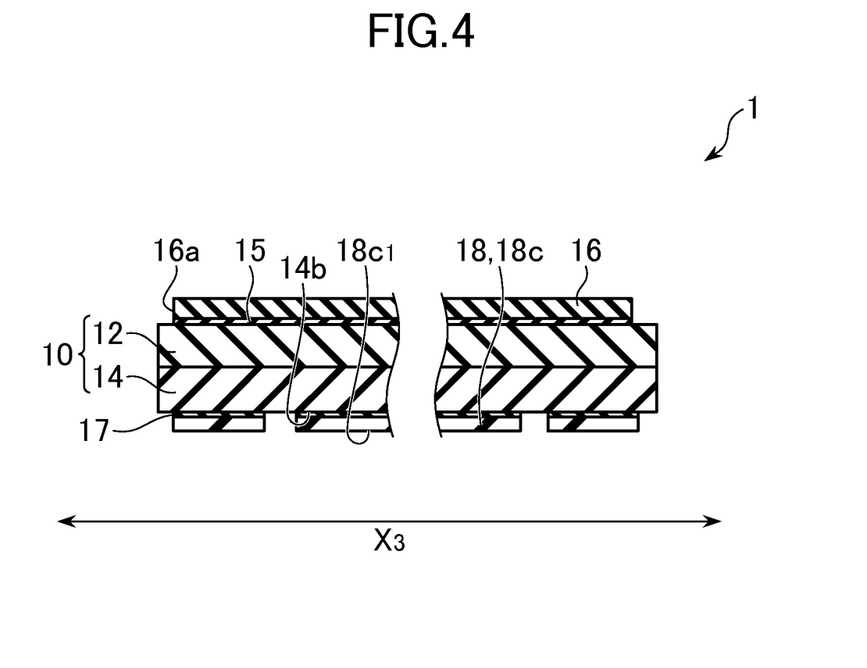
FIG. 4 is a schematic cross-sectional view of the display device shown in FIG. 3, taken along a cutting-plane line IV-IV.

Next, a display device 1 according to a second embodiment of the invention will be described based on the drawings. The second embodiment differs from the first embodiment in that a second heat-shrinkable film 18 is divided into a plurality of strip-shaped bodies 18c. Therefore, configurations relating to the strip-shaped bodies 18c are described below, and the description of configurations similar to those of the display device 1 in the first embodiment is omitted.

FIG. 3 is a schematic plan view of the display device 1 according to the second embodiment. FIG. 4 is a schematic cross-sectional view of the display device 1 shown in FIG. 3, taken along a cutting-plane line IV-IV. The second heat-shrinkable film 18 in the embodiment is divided into the plurality of strip-shaped bodies 18c. The plurality of strip-shaped bodies 18c are arranged spaced apart from each other in a direction $X_3$ orthogonal to a second shrinkage direction $X_2$. A second adhesive layer 17 is divided into a plurality of pieces according to a plan-view shape of the strip-shaped bodies 18c.

The second heat-shrinkable film 18 (strip-shaped body 18c) in the embodiment has light permeability, but may not have light permeability depending on the type of the display device 1. When the strip-shaped body 18c does not need to have light permeability as described above, a lower surface $18c_1$ of the strip-shaped body 18c, which is a surface on the side opposite to a first substrate 12, may be covered with a metal film.

The shrinkage rate of the strip-shaped body 18c in the second shrinkage direction $X_2$ in the embodiment is higher than that of a first heat-shrinkable film 16 in a first shrinkage direction $X_1$. With such a configuration, even when the sum of the areas of regions where the plurality of strip-shaped bodies 18c are bonded to a lower surface 14b of a second substrate 14 is smaller than the area of a region where the first heat-shrinkable film 16 is bonded to an upper surface 12a of the first substrate 12, stress of the first heat-shrinkable film 16 acting in the first shrinkage direction $X_1$ can be relaxed by stress of the strip-shaped bodies 18c acting in the second shrinkage direction $X_2$.

In the display device 1 in the embodiment, the second heat-shrinkable film 18 is divided into the plurality of strip-shaped bodies 18c, which are arranged spaced apart from each other. Therefore, the area of the second heat-shrinkable film 18 (the plurality of strip-shaped bodies 18c) when viewed in plan view is less than that of the display device 1 in the first embodiment. For this reason, the weight of the second heat-shrinkable film 18 in the embodiment becomes less than that of the second heat-shrinkable film 18 in the display device 1 of the first embodiment. As has been described above, weight reduction of the display device 1 and cost reduction can be achieved in addition to the advantageous effects of the display device 1 of the first embodiment.

Figure 5:
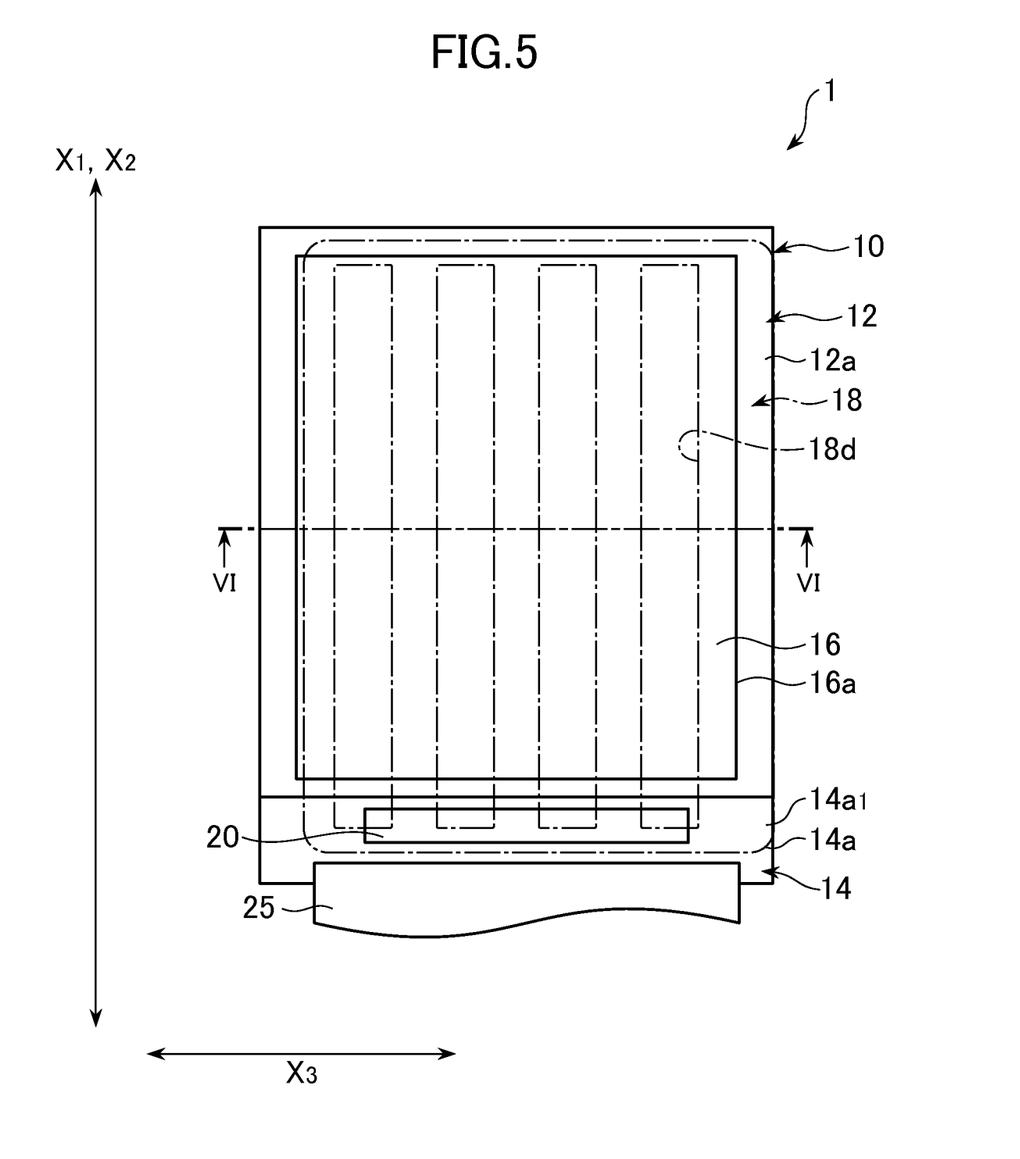
FIG. 5 is a schematic plan view of a display device according to a third embodiment.
Figure 6:
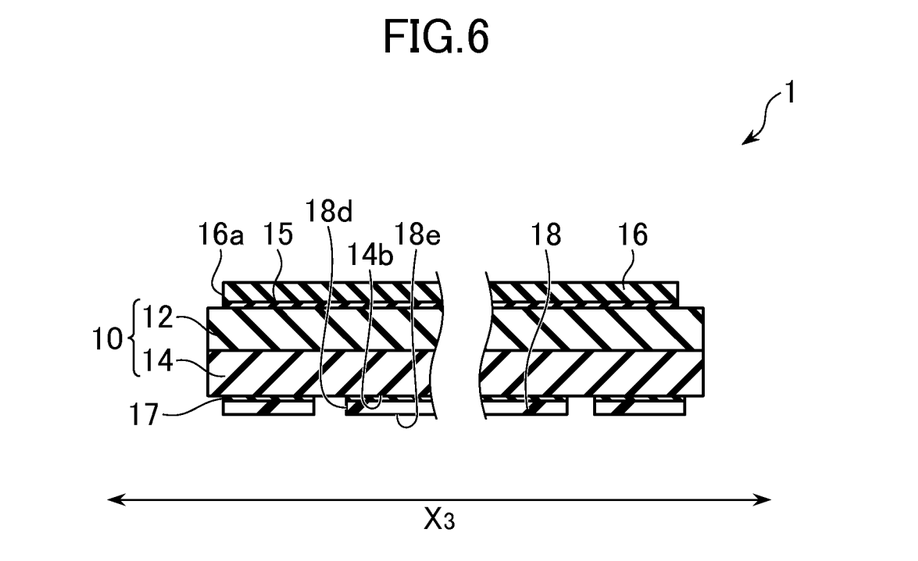
FIG. 6 is a schematic cross-sectional view of the display device shown in FIG. 5, taken along a cutting-plane line VI-VI.

Next, a display device 1 according to a third embodiment of the invention will be described based on the drawings. The third embodiment differs from the first embodiment in that a plurality of slits 18d are disposed in a second heat-shrinkable film 18. Therefore, configurations relating to the slits 18d are described below, and the description of configurations similar to those of the display device 1 in the first embodiment is omitted.

FIG. 5 is a schematic plan view of the display device 1 according to the third embodiment. FIG. 6 is a schematic cross-sectional view of the display device 1 shown in FIG. 5, taken along a cutting-plane line VI-VI. In the second heat-shrinkable film 18 in the embodiment, the plurality of slits 18d are disposed along a second shrinkage direction $X_2$. The slits 18d are disposed spaced apart from each other in a direction $X_3$ orthogonal to the second shrinkage direction $X_2$. A second adhesive layer 17 is formed according to a plan-view shape of the second heat-shrinkable film 18.

The second heat-shrinkable film 18 in the embodiment has light permeability, but may not have light permeability depending on the type of the display device 1. When the second heat-shrinkable film 18 does not need to have light permeability as described above, a lower surface 18e of the second heat-shrinkable film 18, which is a surface on the side opposite to a first substrate 12, may be covered with a metal film.

The shrinkage rate of the second heat-shrinkable film 18 in the second shrinkage direction $X_2$ in the embodiment is higher than that of the first heat-shrinkable film 16 in a first shrinkage direction $X_1$. With such a configuration, even when the area of a region where the second heat-shrinkable film 18 is bonded to a lower surface 14b of a second substrate 14 is smaller than that of a region where the first heat-shrinkable film 16 is bonded to an upper surface 12a of the first substrate 12, stress of the first heat-shrinkable film 16 acting in the first shrinkage direction $X_1$ can be relaxed by stress of the second heat-shrinkable film 18 acting in the second shrinkage direction $X_2$.

In the display device 1 in the embodiment, the plurality of slits 18d are disposed in the second heat-shrinkable film 18. Therefore, the area of the second heat-shrinkable film 18 when viewed in plan view is less than that of the display device 1 in the first embodiment. For this reason, the weight of the second heat-shrinkable film 18 in the embodiment becomes less than that of the second heat-shrinkable film 18 in the display device 1 of the first embodiment. For this reason, weight reduction of the display device 1 and cost reduction can be achieved as described above in addition to the advantageous effects of the display device 1 of the first embodiment.

Moreover, since the second heat-shrinkable film 18 in the embodiment is not divided into a plurality of pieces, cost reduction in manufacturing and prevention of shift in the position of the second heat-shrinkable film 18 can be realized in addition to the advantageous effects of the display device 1 of the second embodiment.

Figure 7:
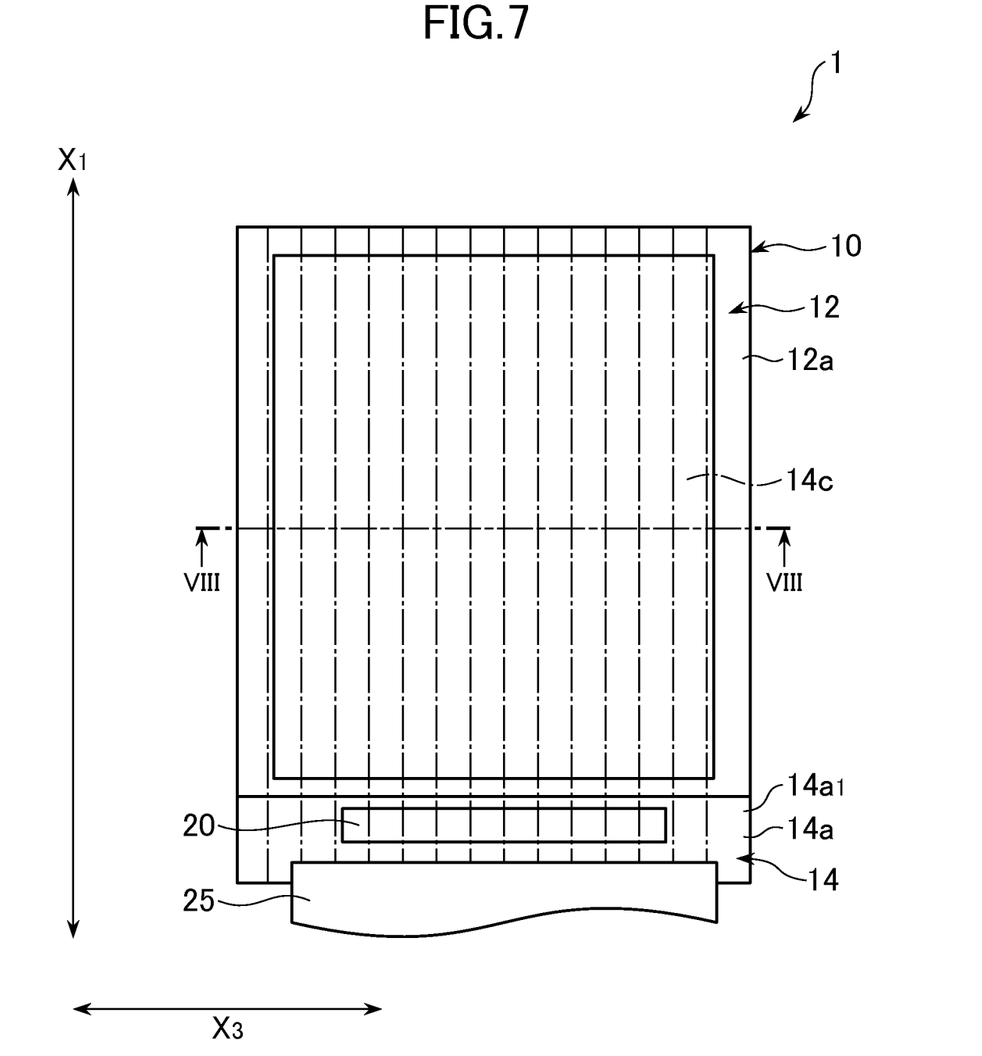
FIG. 7 is a schematic plan view of a display device according to a fourth embodiment.
Figure 8:
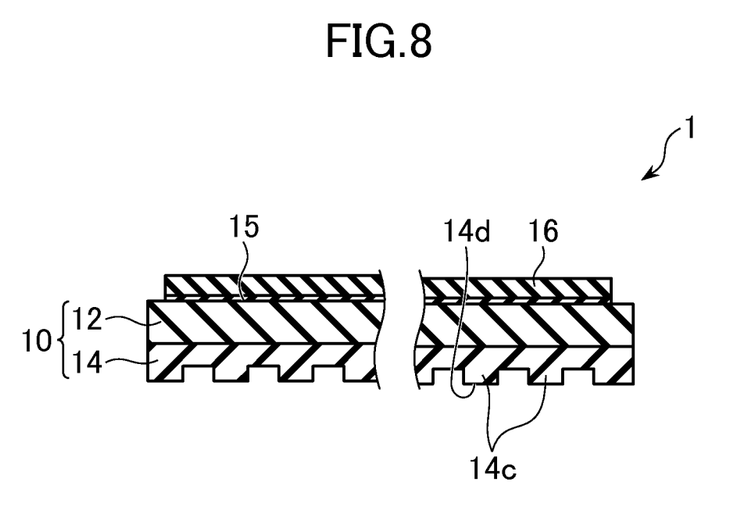
FIG. 8 is a schematic cross-sectional view of the display device shown in FIG. 7, taken along a cutting-plane line VIII-VIII.

Next, a display device 1 according to a fourth embodiment of the invention will be described based on the drawings. The fourth embodiment differs from the first embodiment in that a lower surface 14b of a second substrate 14 constitutes a plate-shaped plurality of wall portions 14c extending along a first shrinkage direction $X_1$ and that a second heat-shrinkable film 18 is not disposed. Therefore, configurations relating to the wall portions 14c are described below, and the description of configurations similar to those of the display device 1 in the first embodiment is omitted.

FIG. 7 is a schematic plan view of the display device 1 according to the fourth embodiment. FIG. 8 is a schematic cross-sectional view of the display device 1 shown in FIG. 7, taken along a cutting-plane line VIII-VIII. The display device 1 according to the embodiment includes a display panel 10 including a first substrate 12 and a second substrate 14 and a first heat-shrinkable film 16 for anti-reflection bonded to an upper surface 12a of the first substrate 12, which is a surface on the side opposite to the second substrate 14, and having different shrinkage rates depending on directions.

The lower surface 14b of the second substrate 14, which is a surface on the side opposite to the first substrate 12, constitutes the plate-shaped plurality of wall portions 14c extending along the first shrinkage direction $X_1$. The plurality of wall portions 14c are configured so as to be spaced apart from each other in a direction $X_3$ that is a direction orthogonal to the first shrinkage direction $X_1$. A lower surface 14d of the wall portion 14c in the embodiment is preferably covered with a metal film.

In the display device 1 in the embodiment, the plurality of wall portions 14c of the second substrate 14 extend along the first shrinkage direction $X_1$ having a highest shrinkage rate among shrinkage directions of the first heat-shrinkable film 16. For this reason, compared to a display device not having this configuration, the second substrate 14 has strong rigidity with respect to stress acting in the first shrinkage direction $X_1$. With such a configuration, in the display device 1 in the embodiment, warpage of the display panel 10 can be suppressed even when the first substrate 12 and the second substrate 14 are thinned, compared to a display device not having this configuration. For this reason, thinning of the display device can be realized.

Moreover, since the display device 1 in the embodiment does not have the second heat-shrinkable film 18, thinning and weight reduction of the display device can be further realized in addition to the advantageous effects of the display device 1 of the first embodiment.

Moreover, in the display device 1 in the embodiment, since the lower surface 14d of the wall portion 14c is covered with a metal film, the heat dissipation property of the display panel 10 can be improved, compared to a display device not having this configuration. For this reason, there is no need to separately dispose a heat-dissipating plate in the display device 1. As has been described above, weight reduction and thinning of the display device 1 can be realized.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a self-light-emitting display panel including a first substrate and a second substrate;
    a first heat-shrinkable film for anti-reflection bonded to a surface of the first substrate on the side opposite to the second substrate and having different shrinkage rates depending on directions; and
    a second heat-shrinkable film bonded to a surface of the second substrate on the side opposite to the first substrate and having different shrinkage rates depending on directions, wherein
    a first shrinkage direction that is a direction having a highest shrinkage rate among directions in which the first heat-shrinkable film shrinks is the same as a second shrinkage direction that is a direction having a highest shrinkage rate among directions in which the second heat-shrinkable film shrinks.

2. The display device according to claim 1, wherein the shrinkage rate of the second heat-shrinkable film in the second shrinkage direction is equal to that of the first heat-shrinkable film in the first shrinkage direction.

3. The display device according to claim 1, wherein a perimeter of the second heat-shrinkable film is located, in plan view, outside a perimeter of the first heat-shrinkable film.

4. The display device according to claim 1, wherein
    the second heat-shrinkable film is divided into a plurality of strip-shaped bodies,
    the plurality of strip-shaped bodies are arranged spaced apart from each other in a direction orthogonal to the second shrinkage direction, and
    the shrinkage rate of the strip-shaped body in the second shrinkage direction is higher than that of the first heat-shrinkable film in the first shrinkage direction.

5. The display device according to claim 1, wherein
    the shrinkage rate of the second heat-shrinkable film in the second shrinkage direction is higher than that of the first heat-shrinkable film in the first shrinkage direction, and
    a plurality of slits are disposed along the second shrinkage direction in the second heat-shrinkable film.

6. The display device according to claim 3, further comprising:
    a first adhesive layer arranged between the first substrate and the first heat-shrinkable film to bond the first substrate and the first heat-shrinkable film together; and
    a second adhesive layer arranged between the second substrate and the second heat-shrinkable film to bond the second substrate and the second heat-shrinkable film together, wherein
    the adhesive force of the second adhesive layer is equal to or less than that of the first adhesive layer.

7. The display device according to claim 1, wherein the thickness of the second heat-shrinkable film is smaller than that of the first heat-shrinkable film.

8. The display device according to claim 1, wherein the first heat-shrinkable film is a polarizer.

9. The display device according to claim 1, wherein the first substrate and the second substrate are formed of a resin.

10. The display device according to claim 1, wherein a surface of the second heat-shrinkable film on the side opposite to the first substrate is covered with a metal film.

11. A display device comprising:
    a self-light-emitting display panel including a first substrate and a second substrate; and
    a first heat-shrinkable film for anti-reflection bonded to a surface of the first substrate on the side opposite to the second substrate and having different shrinkage rates depending on directions, wherein
    a surface of the second substrate on the side opposite to the first substrate constitutes a plate-shaped plurality of wall portions extending along a first shrinkage direction that is a direction having a highest shrinkage rate among directions in which the first heat-shrinkable film shrinks, and the plurality of wall portions are spaced apart from each other in a direction orthogonal to the first shrinkage direction.

12. The display device according to claim 11, wherein the wall portion is covered with a metal film.

13. A display device comprising:
a first heat-shrinkable film having different shrinkage rates depending on directions;
a second heat-shrinkable film having different shrinkage rates depending on directions; and
a self-light-emitting display panel interposed between the first heat-shrinkable film and the second heat-shrinkable film, wherein
the first heat-shrinkable film is bonded on a display side of the display panel,
the second heat-shrinkable film is bonded to a surface of the display panel opposite to the display side, and
a first shrinkage direction that is a direction having a highest shrinkage rate among directions in which the first heat-shrinkable film shrinks is the same as a second shrinkage direction that is a direction having a highest shrinkage rate among directions in which the second heat-shrinkable film shrinks.

* * * * *